United States Patent
Larisch et al.

(10) Patent No.: US 9,698,038 B2
(45) Date of Patent: Jul. 4, 2017

(54) ADAPTER TOOL AND WAFER HANDLING SYSTEM

(71) Applicant: Infineon Technologies AG, Neubiberg (DE)

(72) Inventors: Michael Larisch, Regensburg (DE); Ulrich Beck, Mintraching (DE); Michael Walser, Eilsbrunn/Sinzing (DE)

(73) Assignee: Infineon Technologies AG, Neubiberg (DE)

( * ) Notice: Subject to any disclaimer, the term of this patent is extended or adjusted under 35 U.S.C. 154(b) by 97 days.

(21) Appl. No.: 14/471,588

(22) Filed: Aug. 28, 2014

(65) Prior Publication Data

US 2016/0064258 A1     Mar. 3, 2016

(51) Int. Cl.
*H01L 21/673*     (2006.01)
*H01L 21/677*     (2006.01)

(52) U.S. Cl.
CPC .. *H01L 21/67775* (2013.01); *H01L 21/67379* (2013.01)

(58) Field of Classification Search
CPC ............... H01L 21/673; H01L 21/6734; H01L 21/6735; H01L 21/67373
USPC ...................................................... 414/217.1
See application file for complete search history.

(56) References Cited

U.S. PATENT DOCUMENTS

| | | | | | |
|---|---|---|---|---|---|
| 6,830,651 | B2 * | 12/2004 | Obikane | ........... | H01L 21/67259 118/719 |
| 6,896,470 | B1 * | 5/2005 | Chen | ................. | H01L 21/67772 414/217 |
| 7,073,999 | B2 * | 7/2006 | Oyama | ............. | H01L 21/67369 206/454 |
| 7,187,994 | B1 * | 3/2007 | Ashkenaz | ......... | H01L 21/67775 414/217.1 |
| 7,255,524 | B2 * | 8/2007 | Hofmeister | ....... | H01L 21/67265 250/559.4 |
| 7,410,340 | B2 * | 8/2008 | Bonora | ............. | H01L 21/67775 198/463.3 |
| 7,523,769 | B2 * | 4/2009 | Miyajima | ......... | H01L 21/67017 141/11 |
| 7,611,319 | B2 * | 11/2009 | Shah | ................. | H01L 21/67265 414/217 |
| 8,562,273 | B2 * | 10/2013 | Igarashi | ............ | H01L 21/67775 414/217.1 |
| 8,978,718 | B2 * | 3/2015 | Emoto | ............. | H01L 21/67017 141/51 |
| 2008/0063496 | A1 * | 3/2008 | Bufano | ............. | H01L 21/67017 414/331.01 |

(Continued)

*Primary Examiner* — Kaitlin Joerger
(74) *Attorney, Agent, or Firm* — Murphy, Bilak & Homiller, PLLC

(57) ABSTRACT

An adapter tool that is configured to be attached to a loadport of a wafer handling system includes a support member, and first and second guiding elements supported by the support member. The first and second guiding elements are arranged for placing a first wafer magazine and a second wafer magazine, respectively. The adapter tool further includes a housing supported by the support member that is configured to house the first and the second wafer magazines, respectively, and first and second openings in the housing, respectively. The first and second openings are aligned with the first and second guiding elements.

15 Claims, 8 Drawing Sheets

(56) References Cited

U.S. PATENT DOCUMENTS

| | | | |
|---|---|---|---|
| 2010/0282638 A1* | 11/2010 | Chiu | H01L 21/67373 206/710 |
| 2011/0070055 A1* | 3/2011 | Sasaki | H01L 21/67373 414/217.1 |
| 2011/0188977 A1* | 8/2011 | Toyoda | H01L 21/673 414/411 |
| 2012/0067770 A1* | 3/2012 | Hatano | H01L 21/67775 206/710 |

* cited by examiner

ADAPTER TOOL AND WAFER HANDLING SYSTEM

BACKGROUND

The present specification relates to an adapter tool configured to be attached to a load port of a semiconductor wafer handling system as well as to a wafer handling system.

Semiconductor devices such as transistors, e.g. power transistors, diodes or optoelectronic components for use in e.g. integrated circuits such as processors, memory devices and optoelectronic devices usually are manufactured by processing wafers and singularizing the semiconductor devices after most of the processes for manufacturing the semiconductor device have been performed. In a wafer processing facility comprising a plurality of different apparatuses, e.g. for performing etching processes, photolithographic processes, ion implantation processes and others, the wafers are typically transported in cassettes or magazines, for example front opening universal ports (FOUPs) between the single processing steps. The wafers are transported in the magazines manually or automatically in a clean room, for example. When a single wafer is to be processed in a processing apparatus, the wafers have to be taken out from the magazine, which is usually accomplished by a wafer handling robot. A load port forms an interface between the wafer magazines and the wafer handling robot which takes the single wafers out of the magazines so as to feed them into the processing apparatus.

The wafers may have different sizes. For example, 200 mm wafers have been commonly used and there are wafer handling systems and wafer processing devices that are specifically adapted so as to process 200 mm wafers. In recent years, even larger wafers such as wafers having a diameter of 300 mm have been processed. There are special manufacturing apparatuses which may process the larger wafers. Further, there are processing apparatuses that are adapted to process wafers of different sizes, e.g. 200 and 300 mm.

Accordingly, there is a need for facilitating the handling of wafers having different sizes in a wafer processing facility.

SUMMARY

According to an embodiment, an adapter tool is configured to be attached to a load port of a wafer handling system. The adapter tool comprises a support member, and first and second guiding elements supported by the support member, the first and second guiding elements being arranged for placing a first wafer magazine and a second wafer magazine, respectively. The adapter tool further comprises a housing supported by the support member and being configured to house the first and the second wafer magazines, respectively, and first and second openings in the housing, respectively. The first and second openings are aligned with the first and second guiding elements.

According to a further embodiment, a wafer handling system comprises a load port including a closable window and an adapter tool. The adapter tool comprises a support member, and first and second guiding elements supported by the support member. The first and second guiding elements are arranged for placing a first wafer magazine and a second wafer magazine, respectively. The first and second guiding elements are aligned with the closable window.

According to a further embodiment, a wafer handling system comprises a load port including a closable window and an adapter tool. The adapter tool comprises a support member, a guiding element supported by the support member, the guiding element being arranged for placing a first wafer magazine including wafers of a first size, a housing supported by the support member and being configured to house the first wafer magazine, and an opening in the housing, the opening being aligned with the guiding element. The load port is configured to support a second wafer magazine including wafers of a second size.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of embodiments of the invention and are incorporated in and constitute a part of this specification. The drawings illustrate the embodiments of the present invention and together with the description serve to explain the principles. Other embodiments of the invention and many of the intended advantages will be readily appreciated, as they become better understood by reference to the following detailed description. The elements of the drawings are not necessarily to scale relative to each other. Like reference numbers designate corresponding similar parts.

DETAILED DESCRIPTION

In the following detailed description reference is made to the accompanying drawings, which form a part hereof and in which are illustrated by way of illustration specific embodiments in which the invention may be practiced. In this regard, directional terminology such as "top", "bottom", "front", "back", "leading", "trailing" etc. is used with reference to the orientation of the Figures being described. Since components of embodiments of the invention can be positioned in a number of different orientations, the directional terminology is used for purposes of illustration and is in no way limiting. It is to be understood that other embodiments may be utilized and structural or logical changes may be made without departing from the scope defined by the claims.

The description of the embodiments is not limiting. In particular, elements of the embodiments described hereinafter may be combined with elements of different embodiments.

The terms "wafer", "substrate" or "semiconductor wafer" used in the following description may include any semiconductor-based structure that has a semiconductor surface. Wafer and structure are to be understood to include silicon, silicon-on-insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could as well be silicon-germanium, germanium, or gallium arsenide. According to other embodiments, silicon carbide (SiC) or gallium nitride (GaN) may form the semiconductor substrate material. According to further embodiments, the term "wafer" may relate to any other slice-shaped workpiece that may be made of an arbitrary material comprising insulating materials and conductive materials. The size and the shape of the wafer may be arbitrary. According to an embodiment, the wafer may have a disc-like shape, portions of the wafer being circular, for example, circular and including a flat portion. A diameter of the wafers may range between approximately 50 mm and 1000 mm, for example.

Figure 1:
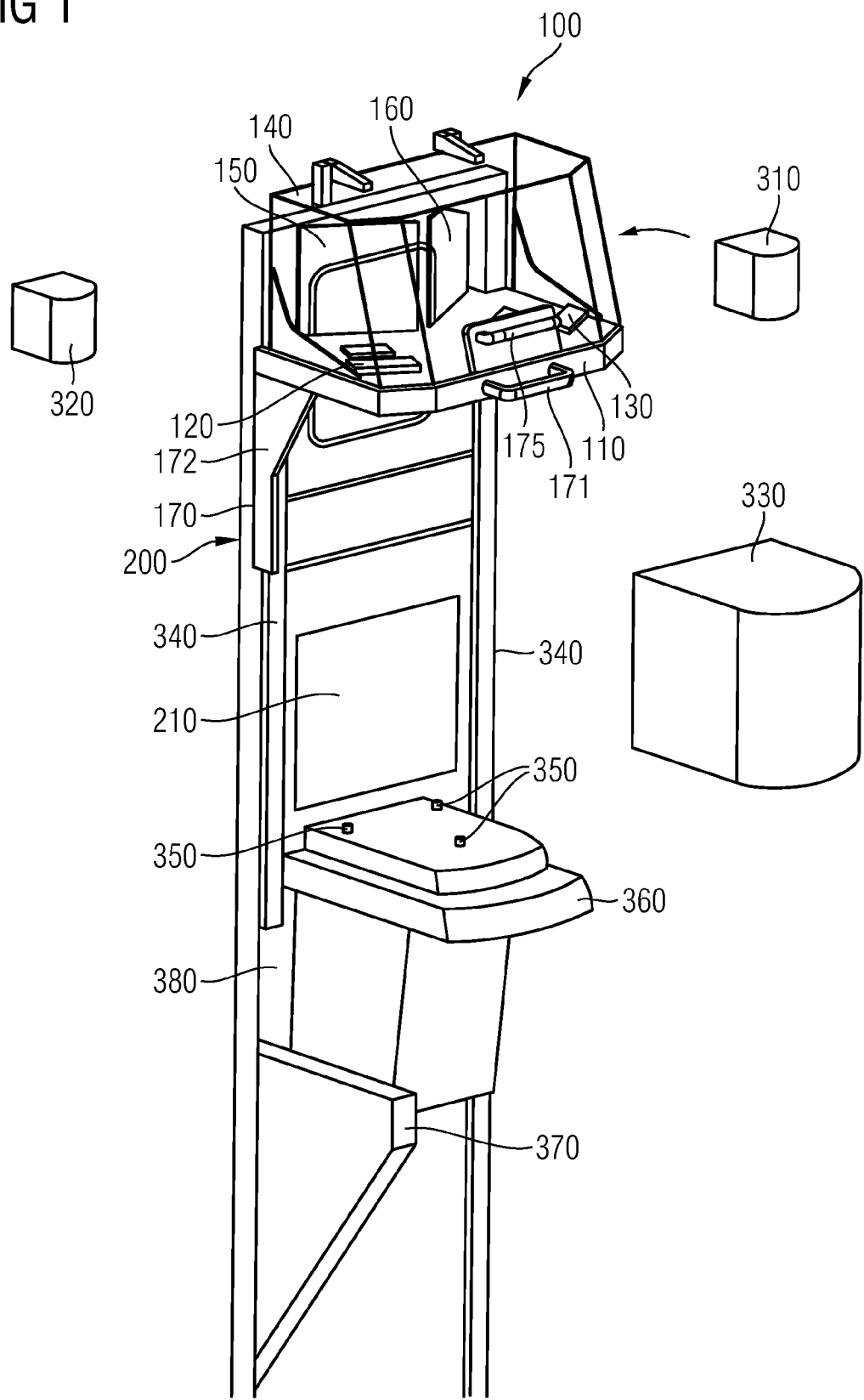
FIG. 1 illustrates elements of a load port including an adapter tool according to an embodiment.

FIG. 1 shows an embodiment of a load port 200 and an adapter tool 100 according to an embodiment. The load port 200 comprises a support element 360 that is attached to a casing 380 of the load port. For example, the support element 360 may be fixedly mounted to the casing 380. The load port further comprises a closable window 210. For example, a wafer magazine 330 housing wafers of a certain size, e.g. 300 mm may be attached to the support element 360. For example, the wafer magazine 330 may be a FOUP (front opening universal port) which may be locked to the support element 360 by means of a positioning member 350 that is attached to the support element 360. When the magazine 330 is locked to the support element 360 by means of a positioning member 350, the window 210 may be opened. Wafers may be taken out of the magazine 330 through the window 210 by a wafer handling robot (not illustrated in this drawing) that is disposed behind the window 210. The load port 200 and the adapter tool 100 are components of a wafer handling system 1000.

The adapter tool 100 may be movably mounted to the casing 380. For example, the adapter tool 100 may be guided by vertical guiding elements 340 in a vertical direction so that it can be moved to be supported by the support element 360 in an easy manner. For example, the vertical guiding elements 340 may be rails. According to further embodiments, the adapter tool 100 may be attached to the casing 380 by alternative mechanisms. The vertical guiding elements 340 may further comprise gas springs so as to allow an automatic movement of the adapter tool to a passive position. The adapter tool 100 illustrated in FIG. 1 is disposed in a non-use position. To be more specific, for putting the adapter tool into use, the adapter tool 100 is pulled down to be supported by the support element 360. The adapter tool 100 may comprise a casing 172. A locking element 170 may be attached to the casing 172. The load port 200 may comprise a contact or engagement member 370 that may be attached to a guiding element 340. When the adapter tool 100 is pulled down to be supported by the support element 360, the locking element 170 may by mechanically locked by the contact member 370. Further, a sensor may detect that the locking element 170 is mechanically locked. For bringing the adapter tool 100 to a passive position, the locking element 170 may be released.

Figure 2A:
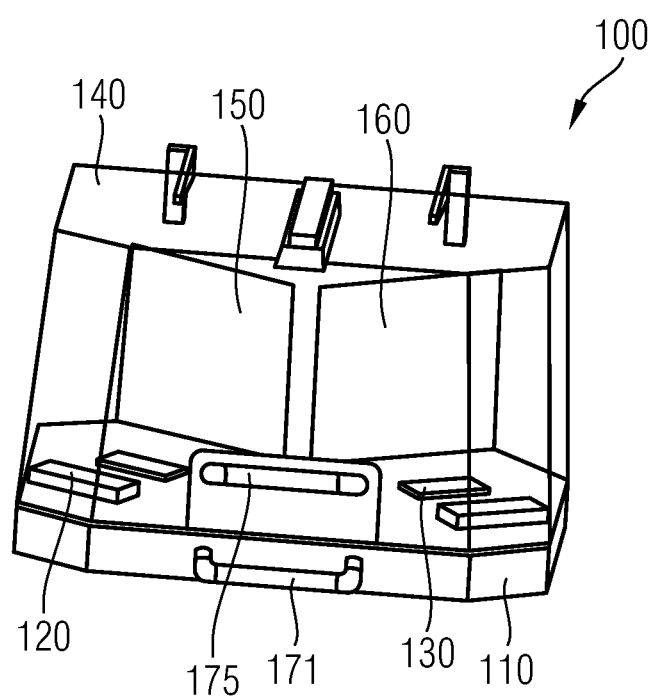
FIG. 2A shows a front view of an adapter tool according to an embodiment.
Figure 2B:
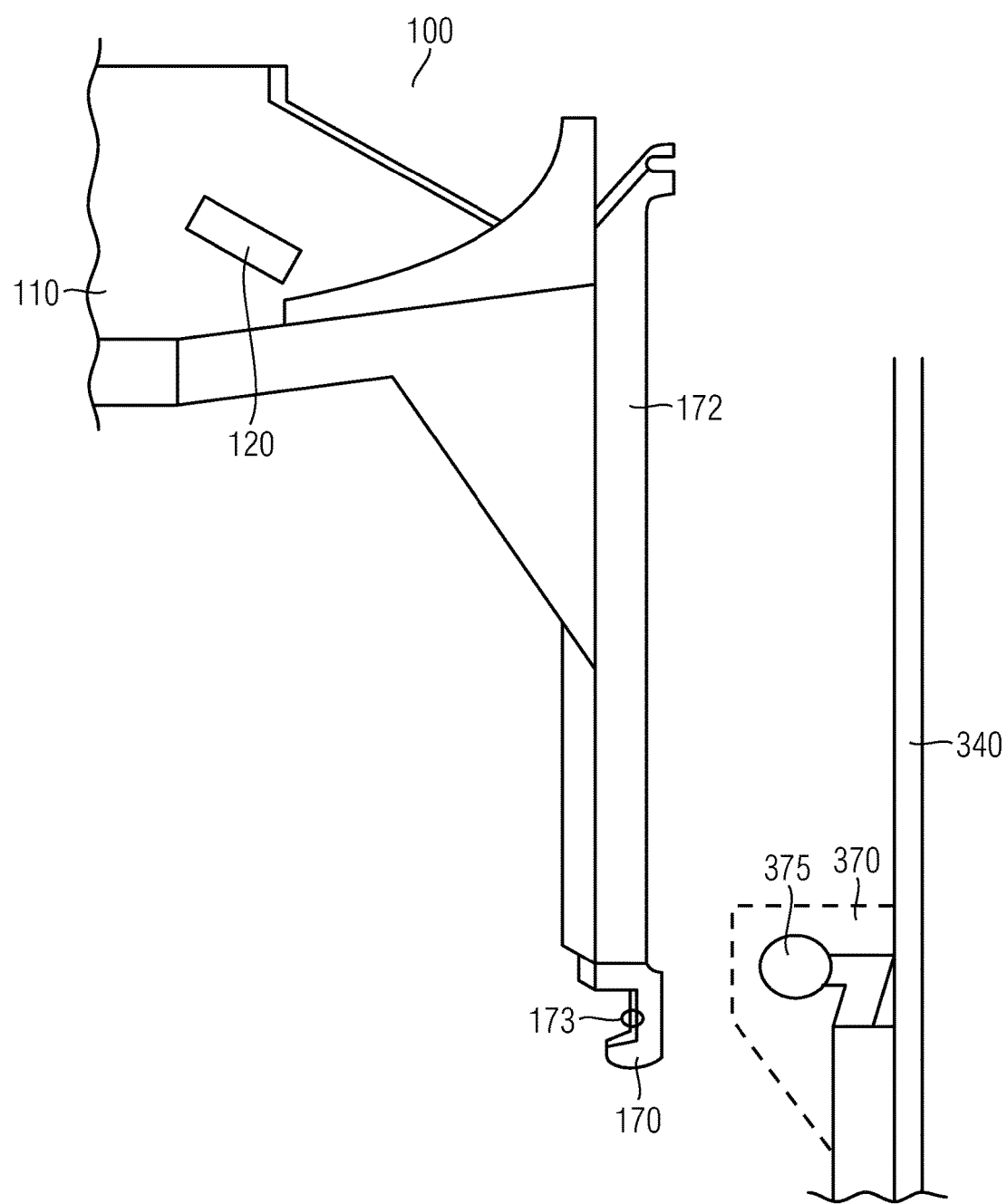
FIG. 2B shows a detailed view of a portion of an adapter tool according to an embodiment and a portion of a load port.

FIGS. 2A and 2B show further details of the adapter tool 100. The adapter tool comprises a support member 110 and a housing 140 which is supported by the support member 110 and which is configured to house a first and a second wafer magazine 310, 320, respectively. The adapter tool 100 further comprises a first opening 150 and a second opening 160 in the housing, respectively. The housing 140 may be made of a transparent material such as a transparent plastic. However, the housing 140 may also be made of an opaque material. The first and the second openings 150, 160 are aligned with the first and the second guiding elements 120, 130. The first and the second openings 150, 150 may be closable. The first and the second guiding elements 120, 130 are supported by the support member 110. The first and the second guiding elements 120, 130 are arranged for placing a first wafer magazine 310 and a second wafer magazine 320. The first and the second openings 150, 160 in the housing are aligned with the first and the second guiding elements 120, 130. As a consequence, wafers disposed in the first and second magazines 310, 320 may be easily accessed via the window 210 of the load port and the first and the second openings 150, 160. For example, the wafers may be taken out by a wafer handling robot.

FIG. 2B which shows a detailed view of a portion of an adapter tool 100. The adapter tool 100 may comprise a casing 172 to which the support member 110 is mounted. The adapter tool 100 may further comprise a locking element 170 that may be mounted to the casing 172. For example, the locking element 170 may comprise a snap-in hook or an engagement hook that may be attached to a lower part of the casing 172. Further, the load port 200 may comprise a contact member 370, that may be attached to the rails 340 or another part of the casing 380. When the adapter tool 100 is dragged to the support element, the contact or engagement member 370 may engage with the snap-in hook so that the adapter tool 100 is locked to the current position. According to an example, the contact member 370 may comprise a roll or a pin or a bolt. When the contact member 370 is engaged with the locking element 170, this locking may be detected by a sensor 173, e.g. an optical or touch sensor.

As is to be acknowledged, the locking element and the contact member may be implemented by any other suitable mechanism, as is general knowledge to the person skilled in the art, and the elements may be arranged at different positions, e.g. vice versa.

As has been described above, due to the presence of the vertical guiding elements 340, the adapter tool 100 may be simply put into use. Hence, the load port of the wafer handling system may be easily refitted or rebuilt so that wafers having different sizes may be handled. Due to the presence of the locking mechanism, the security and stability of the refitted load port may be increased.

Figure 3:
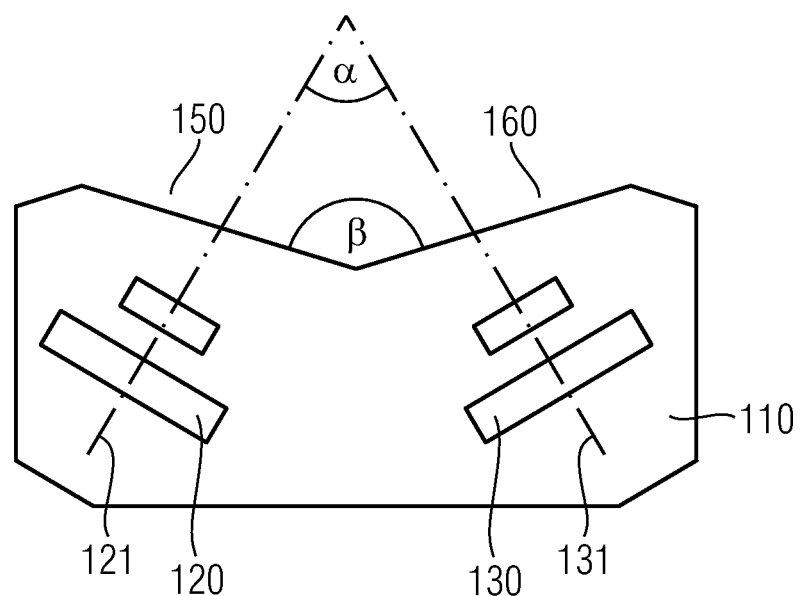
FIG. 3 shows an example of an arrangement of guiding elements according to an embodiment.

FIG. 3 shows a possible arrangement of the guiding elements 120, 130. As is shown in FIG. 3, the guiding element 120 may be arranged along an axis that is rotated with respect to an axis along which the second guiding element 130 is disposed. Angle α denotes the angle between the two axes. For example, the angle α may be 25 to 80°, more specifically, 30 to 70°, e.g. 55 to 65°. The first and the second openings 150, 160 may be disposed so as to form an angle β between the first and the second openings 150, 160. For example, β may be more than 90°, for example, 100 to 160°, more specifically 110 to 150°. Due to the angled arrangement of the guiding elements and the openings, it is possible to access two magazines through one closable window 210.

As illustrated, the guiding elements 120, 130 may be implemented by bar-like elements which may protrude from the support member 110. Generally, the shape of the guiding elements 120, 130, is arbitrary, as long as it is adapted to the shape of the wafer magazine which should be placed on the respective guiding elements. For example, if the guiding elements 120, 130 are protruding portions, the wafer magazines should have correspondingly depressed portions at their back side so as to provide an engagement between the guiding elements and the wafer magazines. Contrary to the embodiment illustrated in FIG. 3, the guiding elements may comprise a single element, respectively which may be aligned perpendicularly with respect to the orientation shown in FIG. 3. For example, the shape and the arrangement of the guiding elements 120, 130 may depend from the topology of a bottom side of the respective wafer magazines that are to be mounted to the guiding elements 120, 130.

Figure 4A:
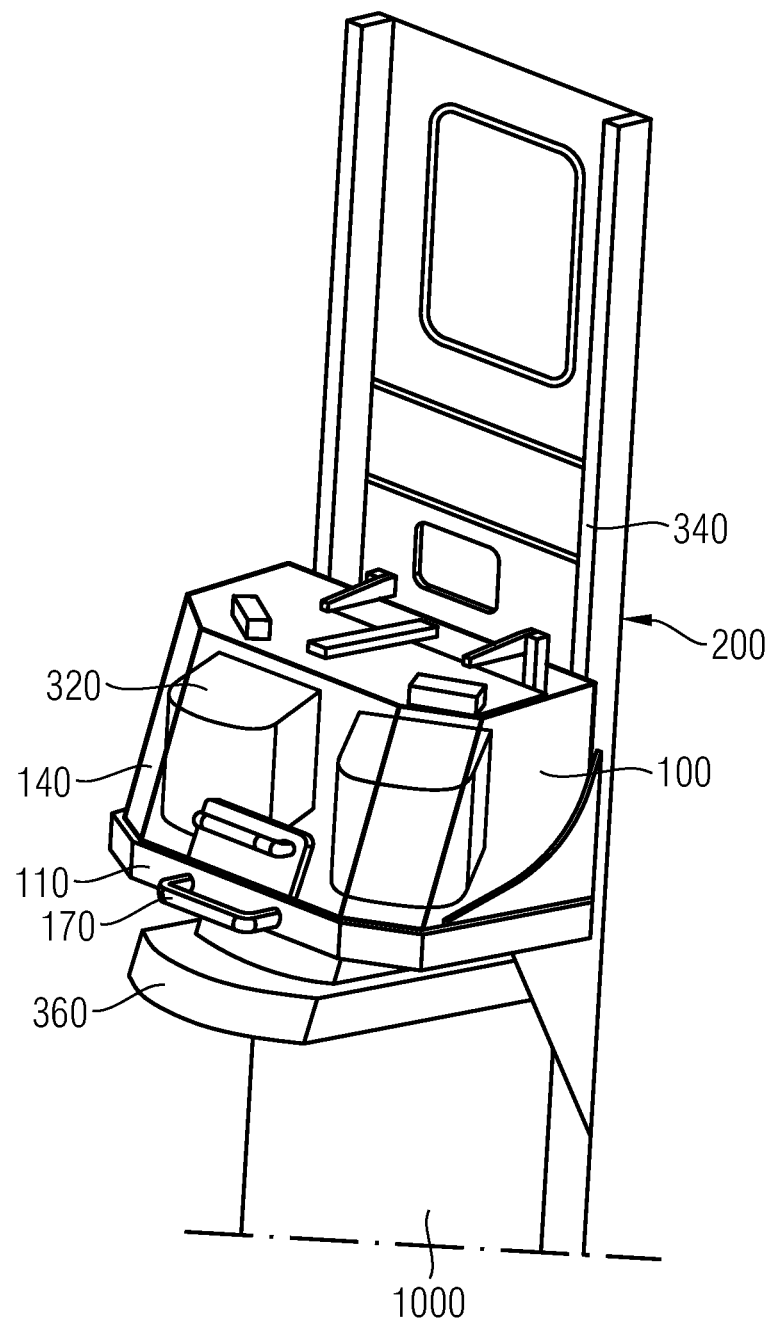
FIG. 4A illustrates elements of a load port including an adapter tool according to a further embodiment.

As is illustrated in FIG. 4A, the adapter tool shown in FIG. 2 may be pulled down to the supporting element 360 of the load port 200 by means of the handle 171. When the adapter tool 100 has been locked to the support element 360, it is possible to open the housing 140, e.g. by means of a second handle 175. For example, the housing may only be opened, when the detector 173 has detected that the adapter tool is locked to the support member 110. Then, a first wafer magazine 310 and a second wafer magazine 320 (illustrated in FIG. 1) may be placed to the first and second guiding elements 120, 130. Thereafter, the housing 140 may be closed. For example, the closable window 210 may be opened only when the housing 140 is closed. After opening the closable window 210, a wafer handling robot (not shown in this drawing) can access the single wafers housed in these magazines.

Figure 4B:
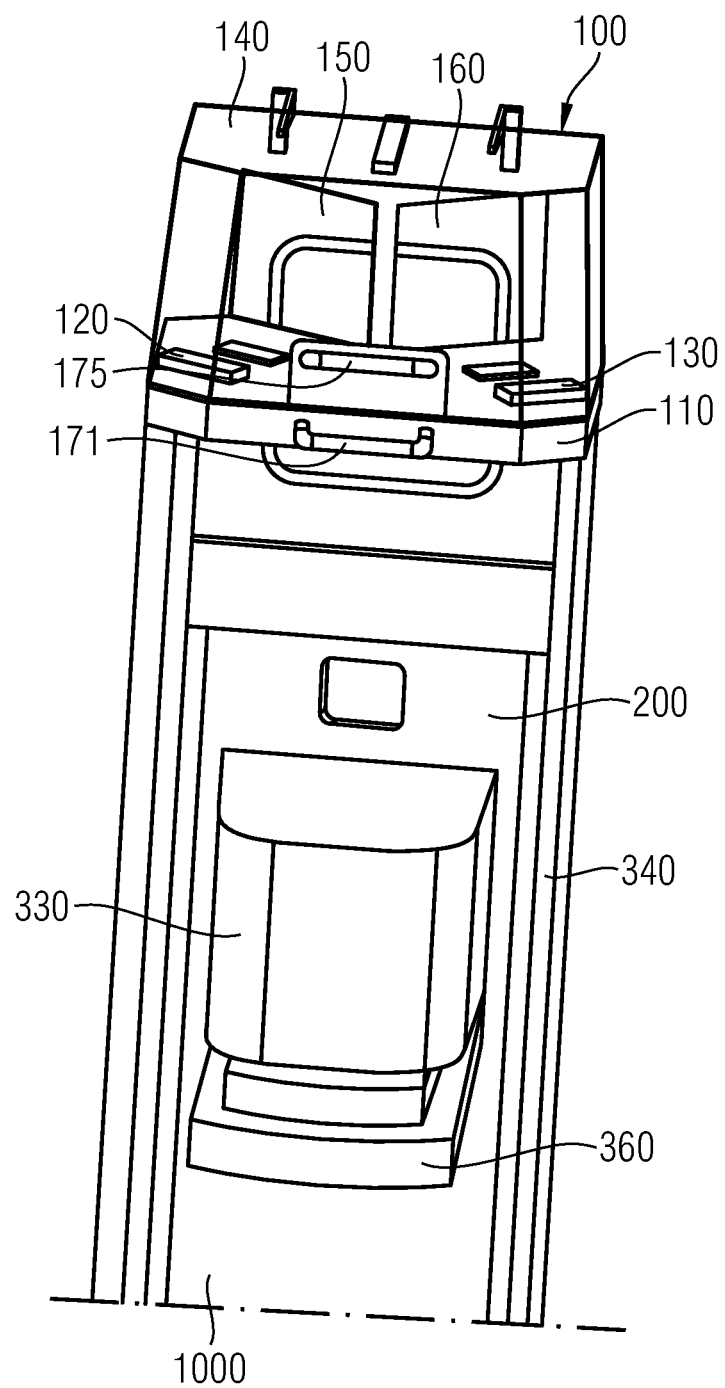
FIG. 4B illustrates elements of a load port including an adapter tool and a wafer magazine.

As illustrated in FIG. 4B, the adapter tool 100 may be shifted to a passive position, which may e.g. be vertically above the support element 360. For example, the locking mechanism comprising the locking element may be released and the adapter tool 100 may automatically move to the passive position. A third wafer magazine 330 may be placed on the support element 360 and may be, e.g. locked by a locking element. Also in this case, the closable window (not shown in this drawing) may be opened so that wafers in the third wafer magazine 330 may be accessed.

For example, the first and second wafer magazines 310, 320 may house wafers having a size that is different from wafers present in the third wafer magazine 330. For example, the wafers (e.g. 200 mm (8") wafers) in the first and second wafer magazines may be smaller than the wafers of the third magazine, which may, e.g. be 300 mm (12") wafers. As has been mentioned before, the load port 300 may comprise rails 340 for guiding the adapter tool along a vertical axis. Nevertheless, as is clearly to be understood, the load port may comprise rails extending in a different direction so as to accomplish a different movement.

According to a further embodiment, the housing 140 of the adapter tool 100 may be dispensed with. In this case, a wafer handling system 1000 comprises a load port 300 including a closable window 210 and an adapter tool 100. The adapter tool 100 comprises a support member 110, and first and second guiding elements 120, 130 supported by the support member 110. The first and the second guiding elements 120, 130 are arranged for placing a first wafer magazine 310 and a second wafer magazine 320, respectively. The first and second guiding elements 120, 130 are aligned with the closable window. The arrangement of the first and second guiding elements may be similar to that illustrated in FIG. 3. The wafer handling system may further comprise a locking member for temporarily locking the adapter tool 100 to a support element 360 of the load port, e.g. in the manner as has been explained above with reference to FIG. 1B. For example, in the context of the present embodiment, the term "locking member" comprises one or plural members for accomplishing this locking. The term "locking member" may, for example, comprise a locking element being a component of the adapter tool 100 and a contact or engagement member being a component of the load port 200. For example, the closable window 210 may only be opened when the adapter tool is locked to the support element. Alternatively, the closable window 210 may be opened when a third wafer magazine 330 is locked to the support element 360.

Figure 5:
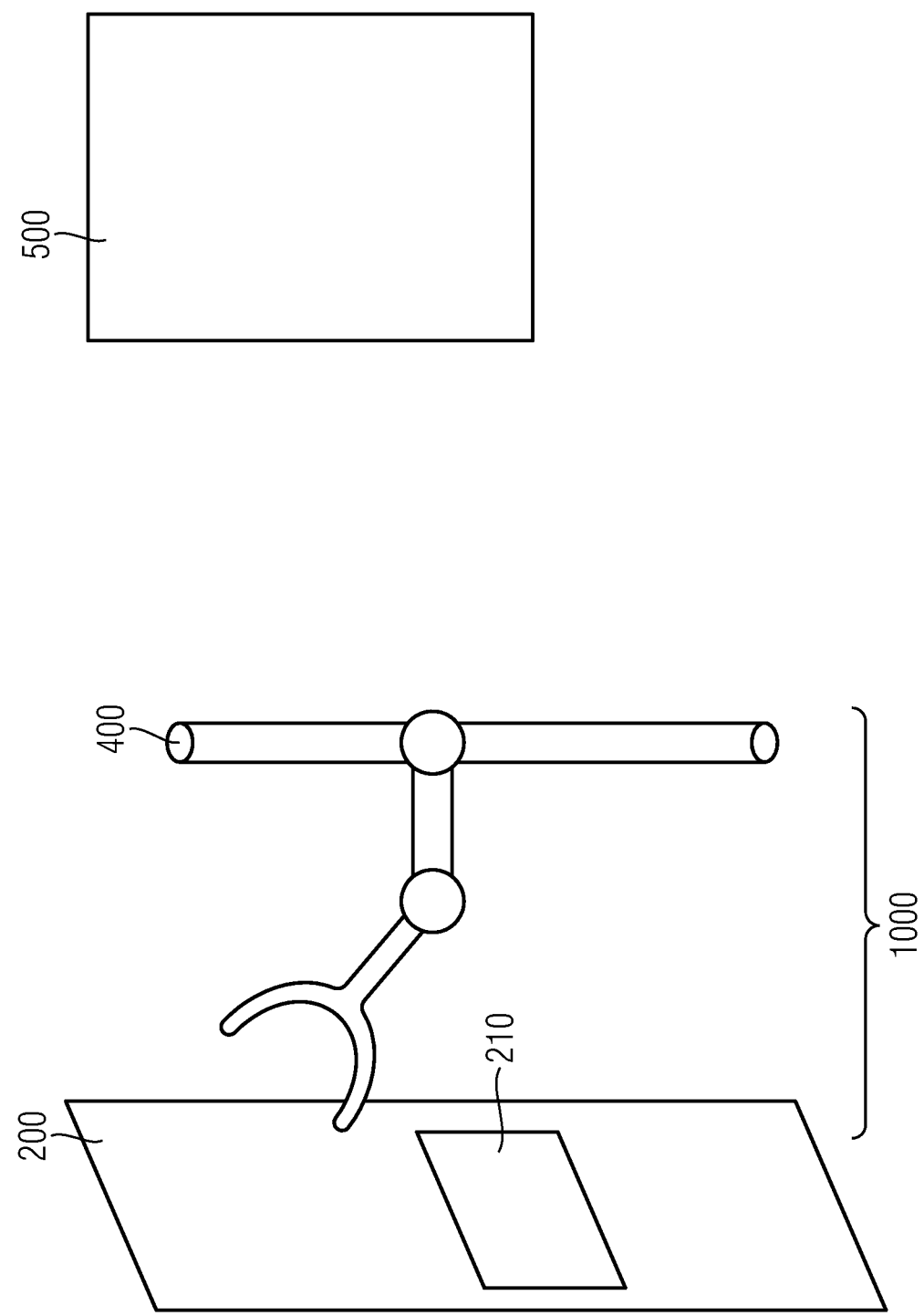
FIG. 5 illustrates further elements of a wafer handling system according to an embodiment.

FIG. 5 shows further elements of the wafer handling system 1000. To be more specific, FIG. 5 shows elements disposed behind the closable window 210 shown in FIG. 1. FIG. 5 shows, on the left-hand side, the load port 200 comprising the closable window 210. The wafer handling system 1000 further comprises a wafer handling robot 400 which may, for example, be a 6-axes-robot. The wafer handling robot 400 may be a robot that is configured to handle wafers of different sizes. The robot 400 may be programmed so as to access a single wafer magazine behind the closable window 210 or multiple wafer magazines which may be disposed behind the closable window 210. For example, when rebuilding or retooling the wafer handling system 1000 by, e.g. pulling the adapter tool to an active or passive position, the robot 400 may be instructed to either handle the wafers from the first and second magazines 310, 320 or from the third magazine 330 alone. Further, the corresponding wafer size may be set. FIG. 5 also shows a wafer processing device 500 such as an etching tool, an ion implantation tool or others. Each single wafer handled by the wafer handling robot 400 may be inserted into the wafer handling tool 500 for performing further processes.

Figure 6:
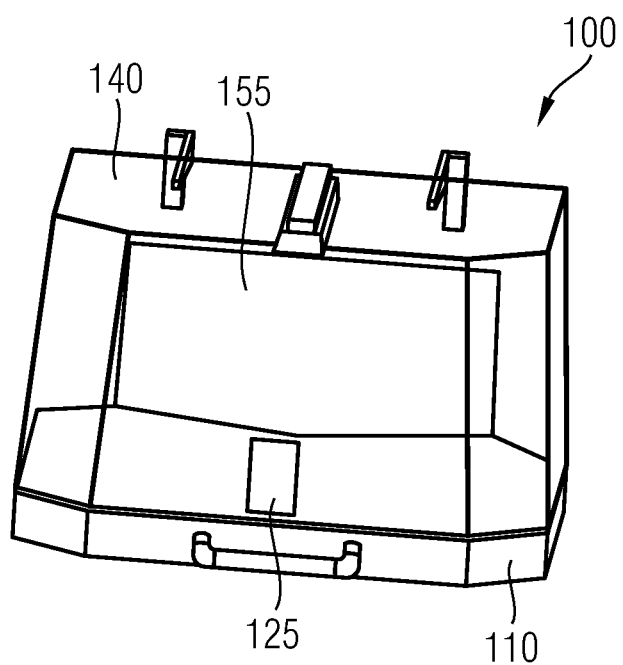
FIG. 6 shows a further embodiment of an adapter tool.

FIG. 6 shows a further embodiment of the adapter tool 100 which may be a component of a wafer handling system 1000 comprising a load port 200 including a closable window 210. For example, the wafer handling system 1000 may be implemented in the manner illustrated in FIGS. 1, 4A, 4B, and 5. The adapter tool 100 comprises a support member 110 and a guiding element 115 which is supported by the support member 110. The guiding element 125 is arranged for placing a first wafer magazine including wafers of a first size. The adapter tool 100 further comprises a housing 140 that is supported by the support member 110 and which is configured to house the first wafer magazine. The adapter tool 100 further comprises an opening 155 in the housing 140, the opening 155 being aligned with the guiding element 125. The load port further is configured to support a second wafer magazine including wafers of a second size which may be different from the first size. Accordingly, differing from the embodiment shown in FIGS. 1 to 3, the adapter tool 100 shown in FIG. 6 may house a single wafer magazine. Since the guiding element 125 is aligned with the opening 150 wafers may be easily taken out from a wafer magazine attached to the guiding element 125. The specific shape of the guiding element 125 is given as an example. The shape of the guiding element 125 may be selected in dependence of a wafer magazine that is to be attached to the guiding element 125.

In a similar manner as has been discussed above, the wafer handling system 1000 may further comprise a locking member for temporarily locking the adapter tool 100 to a support element 360 of the load port 100. For example, in the context of the present embodiment, the term "locking member" comprises one or plural members for accomplishing this locking. The term "locking member" may, for example, comprise a locking element being a component of the adapter tool 100 and a contact or engagement member being a component of the load port 200. For example, the housing 140 may be configured to be opened only when the adapter tool 100 is locked to the support element 360 of the load port 200.

As has been described in the forgoing with respect to all embodiments, the adapter tool 100 may be easily mounted to the load port 200 and may be moved and put into use in an easy manner. Accordingly, when handling wafers from the first or second wafer magazine, the first or second wafer magazine may be easily placed on the adapter tool and may be easily accessed by means of the wafer handling robot. Further, due to the presence of two guiding elements, the number of wafer magazines to be processed may be increased. According to an embodiment, the housing may be opened only when the adapter tool is fixedly mounted to the support element of the load port. Further, the closable window 210 may be only be opened if a wafer magazine is locked to the support element or when the adapter tool is locked to the support element and the housing 140 is closed. Thereby, the working position of the wafer magazines may be determined in a reproducible manner. Further, due to the presence of the guiding members, which are aligned with the openings of the housing, the positions of the first and second wafer magazines may be fixed and adjusted in a reproducible manner.

While embodiments of the invention have been described above, it is obvious that further embodiments may be implemented. For example, further embodiments may comprise any sub-combination of features recited in the claims or any sub-combination of elements described in the examples given above. Accordingly, this spirit and scope of the appended claims should not be limited to the description of the embodiments contained herein.

What is claimed is:

1. An adapter tool configured to be attached to a loadport of a wafer handling system, the adapter tool comprising:
    a support member;
    first and second guiding elements attached to the support member and being juxtaposed to each other, the first and second guiding elements being arranged for placing a first wafer magazine and a second wafer magazine, respectively;
    a housing supported by the support member and being configured to house the first and the second wafer magazines, respectively; and
    first and second openings in the housing, respectively, the first and second openings being aligned with the first and second guiding elements, the first and second openings being disposed so as to form an angle between the first and the second opening.

2. The adapter tool according to claim 1, wherein the first guiding element is arranged along an axis that is rotated with respect to an axis of the second guiding element.

3. The adapter tool according to claim 1, further comprising a locking element for temporarily locking the adapter tool to a support element of the load port.

4. The adapter tool according to claim 3, wherein the housing is configured to be opened only when the adapter tool is locked to the support element.

5. A wafer handling system comprising a load port including a closable window and the adapter tool according to claim 1.

6. The wafer handling system according to claim 5, wherein the adapter tool is configured to simultaneously support the first and the second wafer magazines including wafers of a first size, respectively, and the load port is configured to support a third wafer magazine including wafers of a second size.

7. The wafer handling system according to claim 5, wherein the load port further comprises vertical guiding elements configured to guide a movement of the adapter tool along a vertical axis.

8. The wafer handling system according to claim 5, further comprising a locking member for temporarily locking the adapter tool to a support element of the load port, wherein the load port is operable to open the closable window, only if the adapter tool is locked to the support element.

9. A wafer handling system comprising a load port including a closable window and an adapter tool comprising:
    a support member; and
    first and second guiding elements attached to the support member and being juxtaposed to each other, the first and second guiding elements being arranged for placing a first wafer magazine and a second wafer magazine, respectively, the first and second guiding elements being aligned with the closable window, the load part comprising vertical guiding elements configured to guide a movement of the adapter tool along a vertical axis.

10. The wafer handling system according to claim 9, wherein the first guiding element is arranged along an axis that is rotated with respect to an axis of the second guiding element.

11. The wafer handling system according to claim 9, wherein the first guiding element is arranged along an axis that is displaced in parallel to an axis of the second guiding element.

12. The wafer handling system according to claim 9, further comprising a locking member for temporarily locking the adapter tool to a support element of the load port.

13. A wafer handling system comprising a load port including a closable window and an adapter tool, wherein the adapter tool comprises:
    a support member;
    a guiding element supported by the support member, the guiding element being arranged for placing a first wafer magazine including wafers of a first size;
    a housing supported by the support member and being configured to house the first wafer magazine; and
    an opening in the housing, the opening being aligned with the guiding element,
    wherein the loadport is configured to support a second wafer magazine including wafers of a second size, the load port further comprising vertical guiding elements configured to guide a movement of the adapter tool along a vertical axis.

14. The wafer handling system according to claim 13, further comprising a locking member for temporarily locking the adapter tool to a loadport support member of the loadport.

15. The wafer handling system according to claim 14, wherein the housing is configured to be opened only when the adapter tool is locked to the loadport support member.

* * * * *

UNITED STATES PATENT AND TRADEMARK OFFICE
CERTIFICATE OF CORRECTION

PATENT NO. : 9,698,038 B2  
APPLICATION NO. : 14/471588  
DATED : July 4, 2017  
INVENTOR(S) : M. Larisch et al.

Page 1 of 1

It is certified that error appears in the above-identified patent and that said Letters Patent is hereby corrected as shown below:

On the Title Page

Column 2, Abstract, Line 1, please change "loadport" to -- load port --

In the Claims

Column 7, Line 34, (Claim 1, Line 1) please change "loadport" to -- load port --
Column 8, Line 24, (Claim 9, Line 9) please change "load part" to -- load port --
Column 8, Line 50, (Claim 13, Line 12) please change "loadport" to -- load port --
Column 8, Line 57, (Claim 14, Line 3) please change "loadport" to -- load port --
Column 8, Line 58, (Claim 14, Line 4) please change "loadport" to -- load port --
Column 8, Line 62, (Claim 15, Line 3) please change "loadport" to -- load port --

Signed and Sealed this  
Twenty-sixth Day of September, 2017

Joseph Matal  
*Performing the Functions and Duties of the*  
*Under Secretary of Commerce for Intellectual Property and*  
*Director of the United States Patent and Trademark Office*